United States Patent

[11] 3,588,731

[72] Inventors Herbert Hoeffer
Grafing; Herbert Knirsch, Erding-Klettham; Siegfried Rehm, Stockdorf, all of Germany
[21] Appl. No. 791,991
[22] Filed Jan. 17, 1969
[45] Patented June 28, 1971
[73] Assignee Schlumberger overseas Messgeratebau und Vertrieb GmbH
Munich, Germany
[32] Priority Jan. 20, 1968
[33] Germany
[31] P 16 16 327.2

[54] AUDIO TO UHF FREQUENCY SYNTHESIZER INCLUDING A PLURALITY OF PHASE-LOCKED OSCILLATORS
13 Claims, 1 Drawing Fig.

[52] U.S. Cl. .......... 331/2, 331/22, 331/25, 331/40, 331/41
[51] Int. Cl. .......... H03b 3/04
[50] Field of Search .......... 331/2, 18, 22, 25, 37, 40, 41

[56] References Cited

UNITED STATES PATENTS

| | | | |
|---|---|---|---|
| 2,775,701 | 12/1956 | Israel | 331/2 |
| 3,208,005 | 9/1965 | Guttman et al. | 331/2 |
| 3,268,831 | 8/1966 | Noordanus et al. | 331/2 |
| 3,365,676 | 1/1968 | Buss | 331/18X |

FOREIGN PATENTS

| | | | |
|---|---|---|---|
| 888,587 | 1/1962 | Great Britain | 331/2 |

*Primary Examiner*—Roy Lake
*Assistant Examiner*—Siegfried H. Grimm
*Attorneys*—William R. Sherman, Stewart F. Moore and Jerry M. Presson

ABSTRACT: A frequency synthesizer provides a plurality of selectable values of signal frequencies ranging from low audio to UHF having good short- and long-term stability. The synthesizer includes a basic oscillator for generating a good long-term stabilized frequency, an auxiliary oscillator phase-locked with the basic oscillator for generating a good short- and long-term stabilized auxiliary frequency, and a plurality of voltage-controlled oscillators in phase-locked relationship with said auxiliary frequency for producing different selectable frequencies which correspond to the selected values of signal frequencies. The frequency corresponding to the most significant value of the selected frequency is obtained by mixing a frequency from an appropriate selected one of the voltage-controlled oscillators with a submultiple harmonic of the auxiliary frequency. Frequencies of intermediate and lower orders of significance are obtained from various subfrequency generating stages and are mixed with the frequency derived from the selected voltage-controlled oscillator to provide a phase-locked control voltage for fine frequency adjustment of that oscillator. An output mixing stage mixes the frequency of the finely-adjusted selected oscillator with a frequency derived from said auxiliary frequency to provide an output frequency of selected values having good short- and long-term stability.

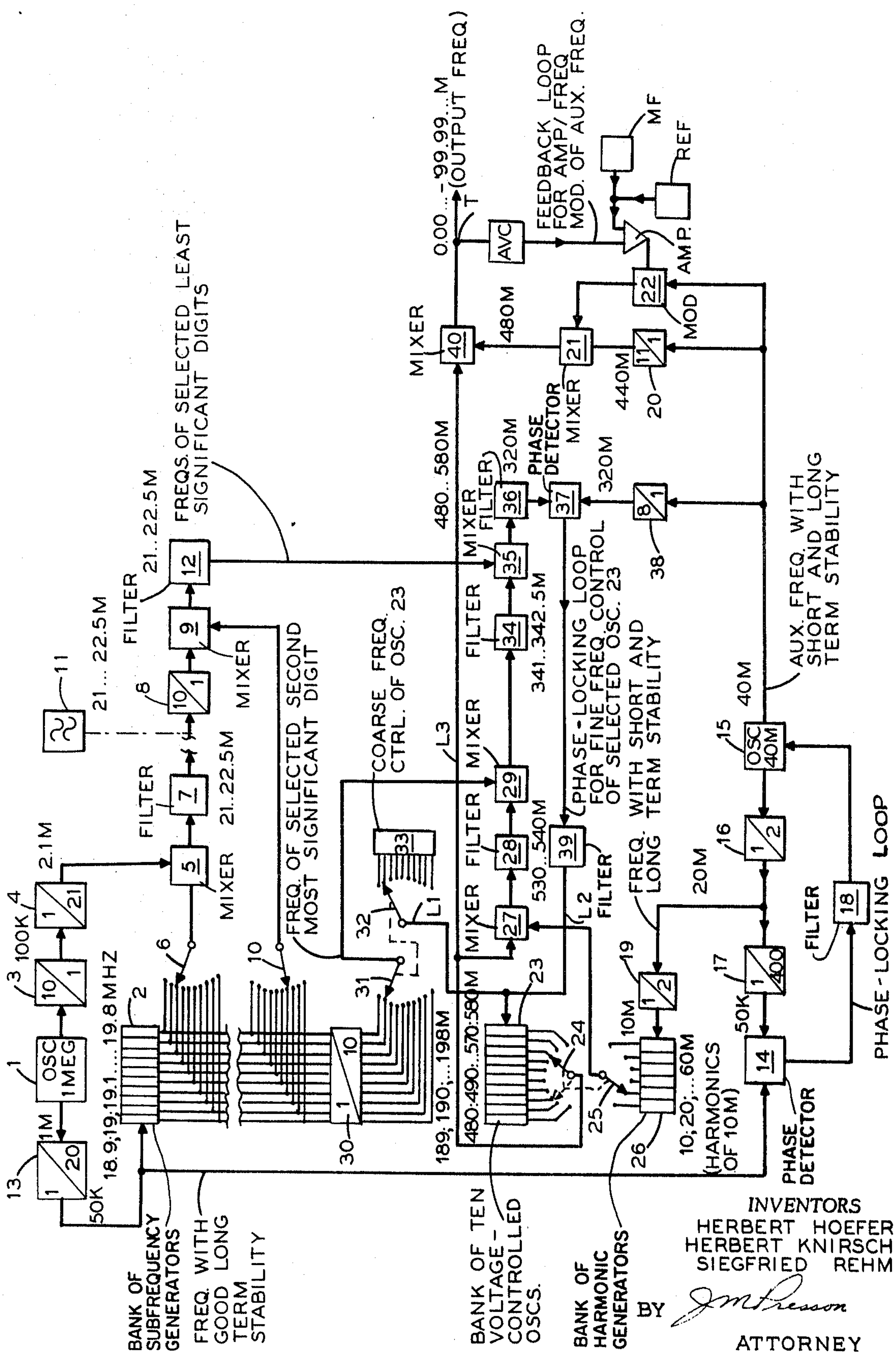
INVENTORS
HERBERT HOEFER
HERBERT KNIRSCH
SIEGFRIED REHM
BY J. M. Fresson
ATTORNEY

AUDIO TO UHF FREQUENCY SYNTHESIZER INCLUDING A PLURALITY OF PHASE-LOCKED OSCILLATORS

This invention relates generally to frequency synthesizers and more particularly, to frequency synthesizers for generating a selected one of a large range of signal frequencies.

Frequency synthesizers of the type presently under consideration are conventionally utilized to provide a certain frequency which may be selected by means of switches and the like, from a band of available frequencies. The frequency provided by the synthesizer usually must comply with certain requirements, particularly as to accuracy and stability.

In the output stage of conventional synthesizers a difference frequency is formed between a fixed frequency and a frequency which is selectable, either manually or electronically by means of switching devices. The switching devices are usually arranged in decades to provide finer and finer frequency division in the selectable frequency. The difference frequency thus obtained is the desired output frequency of the synthesizer. In such a manner, relatively low frequencies can be generated with considerable accuracy.

However, since in these conventional synthesizers it is a subtraction of one frequency from another which yields the difference frequency, it follows that the fixed frequency and the selectable frequency are necessarily much higher than the highest desired output frequency. To provide relatively high output frequencies, the frequency synthesizing process has become increasingly complex and has required circuits of increasing complexity and cost, especially as the output frequency requirements are increased to 1 MHz or greater. For these reasons, conventional frequency synthesizers typically have a maximum output frequency of about 1 MHz.

In frequency synthesizers the fixed and the selectable and by direct implication, the variable frequency must be frequency stabilized over the short and long term of synthesizer operation in order to provide meaningful frequency outputs. For the fixed frequency the problem of achieving such stabilization is less troublesome because one can achieve fairly good degree of stabilization of a nonvariable frequency by employing conventional frequency multiplication and division stages.

For the selectable frequency, however, an oscillator provides the frequency which must be controlled within certain selected frequency limits. The oscillator is sometimes phase-locked against a precise, stabilized frequency by means of a phase-locking loop. If the oscillator frequency deviates from the stabilized frequency, an error signal is generated within the phase-locking loop of such magnitude and polarity as to tend to correct for the deviation of the oscillator frequency.

This phase-locking technique as applied to conventional synthesizers has serious limitations especially as the fixed and selectable frequencies which require phase-locking are within the UHF domain because in this domain phase incoherences or so-called "phase-noise" may be generated. These phase incoherences typically introduce significant errors in the generated output frequency.

Additionally in order to obtain a good long term stability, which is required in practically every application for a synthesizer, it is necessary to obtain the stabilizing frequency from an oscillator, often referred to as a "baisc" oscillator, which oscillates at a relatively low frequency and amplitude. The multistage frequency multiplication required to convert this relatively low basic frequency into very high frequencies which are necessary to generate high frequency outputs results in the output frequencies having a relatively poor short term stability, which is not usually tolerable.

It is an object of this invention to provide a new and improved frequency synthesizer which avoids many of the problems of conventional synthesizers and makes available an extended range of selectable frequencies.

Another object of this invention is to provide a frequency synthesizer which produces a selected frequency from a frequency band ranging from low audio to ultrahigh frequencies.

Still another object of this invention is to provide a plural channel frequency generator which produces a selectable stabilized frequency from a frequency band ranging from very low audio to almost 100 MHz.

For reasons related hereinbelow, in accordance with the instant invention, the range covered by known prior art frequency synthesizers is extended by approximately two orders of magnitude with the corresponding advantageous result that the instant invention has a relatively wide possible field of application.

Briefly described, the present invention includes means for generating a first frequency which is stabilized over a long term, second means for generating an auxiliary frequency at an output, the second means being phase-locked with the first means so that the auxiliary frequency has good stability over both a short and long term, third means coupled to the second means and phase-locked to the auxiliary frequency for producing frequencies having good short and long term stability corresponding to selected values of output signal frequencies, and means coupled to the outputs of the second and third means for mixing the frequency output of the third means with a frequency derived from the auxiliary frequency to provide the selected output frequency having both good short and long term stability.

In order that the manner in which the foregoing and other objects are attained in accordance with the invention can be understood in detail, a particularly advantageous embodiment thereof will be described with reference to the accompanying drawing, which forms a part of this specification and which shows a schematic block diagram of a preferred embodiment of the invention.

The instant synthesizer is illustrated schematically by the single accompanying drawing. With reference to the drawing, the instant synthesizer includes an output frequency mixing stage 40 for delivering an output frequency which is the difference between a fixed frequency and a stepwise selectable frequency. The synthesizer also includes an oscillator 1 which may be referred to as a "basic" oscillator, and is preferably precisely controlled to produce a constant output frequency. Also included is at least one voltage-controllable oscillator which may be referred to as a "main" oscillator and is selectable from a bank 23 of, for example, 10 such oscillators having different mean frequencies of operation for generating various ranges of selectable frequencies. Additionally, at least one oscillator 15, which may be referred to as an "auxiliary" oscillator, is provided for generating an auxiliary frequency, the fixed frequency delivered to the stage 40 being a whole multiple of the auxiliary frequency output of the auxiliary oscillator 15.

The auxiliary oscillator 15 possesses a good short term stability and is typically comprised of a quartz-crystal oscillator whereas the basic oscillator 1, while also typically being comprised of a quartz-crystal oscillator, possesses good long term stability through, for example, thermal regulation of ambient conditions. The oscillator 15 is phase-locked to the oscillator 1 by means of a phase-locking loop, referred to as such on the drawing, having a low band pass filter (or damping circuit) 18 therein.

To obtain a frequency equal to the most significant number or digit of a selected plural-digit frequency value, the output of a selected one of the oscillators 23 is mixed in a mixer stage 27 with a selected harmonic of a submultiple of the auxiliary frequency derived from a selected one of six harmonic generators 26. To obtain a subfrequency equal to the next-to-most significant number of the selected frequency the selected main oscillator in the bank 23 is coarsely tuned to a frequency defined by this number. The coarse tuning of the selected main oscillator may be affected by supplying, via a switch 32, a further DC control voltage from the source 33 to the selected main oscillator. The corresponding subfrequency is derived from a frequency multiplying stage 30, via a switch 31 toggled to operate with the switch 32, and then mixed in a mixer stage 29 with the filtered output of the mixer 27 to generate a frequency representing the second most significant digit. The lower order subfrequencies required to define selected numbers of the lesser orders of significance are generated by a bank of oscillators 2 and may be multiplied as necessary to supply required frequencies to associated mixer stages. These lower-order subfrequencies are applied to one input of a mixer stage 35 and are phase-locked by operation of a second phase-locking loop, having a low band pass filter (or damping circuit) 39 therein, against a reference frequency derived after multiplication in a multiplier 38 from the auxiliary frequency obtained from the oscillator 15. Fine tuning the selected main oscillator in the bank 23 to obtain the finer selected frequencies is then accomplished by means of this second phase-locking loop feeding back, via the lead L2, a slowly varying compensating voltage to the selected main oscillator.

Since the oscillator 15 generating the auxiliary frequency is phase-locked with the oscillator 1, the auxiliary output frequency of the oscillator 15 possesses both good short and long term stability. This feature is important particularly in those instances where the synthesizer is required to provide very low output frequencies because in such instances the fixed frequency and the selectable frequency subtracted therefrom are derived from one and the same oscillator, that is, the oscillator 15. As a consequence thereof, disturbing phase incoherences do not exist and the output frequency stability can never be worse then the stability of the basic oscillator 1.

As mentioned above, the selectable frequency is varied by introducing into the phase-locking loop those of the subfrequencies which are to be mixed with the main oscillator frequency, the main oscillator frequency being obtained from a selected one of the oscillators in the band 23 and being finely varied in a compensating sense by the regulating signal present in the phase-locking loop. The phase-locking loop includes a phase detector 37 which serves to lock the phase of the signal derived from selected main oscillator with a reference frequency derived from the auxiliary oscillator 15, for the reason that the short term stability of the reference frequency supplied to the detector 37 is normally greater than the short term stability of the main oscillator frequency. The damping circuit 39 is included in the phase-locking loop to prevent transient oscillations from being fed back to the selected oscillator, particularly during switching operations involved in selecting different frequencies of the desired output frequency. The circuit 39 has a low pass band characteristic, the upper frequency limit thereof being so low in comparison with the operating frequencies that the regulating signal for the fine tuning of the selected main oscillator in the bank 23 may be described as a slow time-varying or DC voltage. The frequency range accorded each oscillator in the bank 23 is determined by the total frequency range of the bank 23.

To extend the range of the instant synthesizer by one order of magnitude, the band 23 is comprised of 10 oscillators and each oscillator is preferably tunable to within one-tenth the total frequency range thereof.

Each main oscillator is selectable simultaneously with one filter in a bank of filters 26 through operation of switches 24 and 25, respectively, to obtain the selection of that harmonic of a submultiple of the auxiliary frequency which will generate a first intermediate frequency which is within the pass band of a first tuned filter 28 in the phase-locking loop. This first intermediate frequency is filtered and then mixed in a mixing stage 29 with that one of the highest subfrequency, selected through operation of the switch 31, which will generate a second intermediate frequency that lies within the pass band of a second tuned filter 34. The filter 34 is tuned to the lower side band frequency of the second intermediate frequency and the bandwidth thereof is considerably narrower than that of the first filter 28. This second intermediate frequency is then mixed with a selected one of the lower subfrequencies derived from, for example, the decade of oscillators 2 in order to generate a third intermediate frequency which lies within the pass band of a third filter 36. The filter 36 is tuned to a narrower frequency than the preceding filter 34, and more specifically, is tuned so that the lower pass band frequency is identical to the stabilized reference frequency.

Many, if not most, applications of frequency synthesizers require an output frequency of constant amplitude or require that the output frequency be modulated with a low frequency signal. In the output stage 40 the fixed or constant frequency obtained from a mixer 21 and the selected frequency obtained from a main oscillator in the decade 23 are subtracted algebraically. The signal of selected frequency usually has enough amplitude to drive the mixer 40 properly, but the fixed frequency simultaneously supplied to the mixer may not have a suitably comparable amplitude. In such case it is requisite that an amplitude-controlled voltage be automatically superimposed upon the fixed signal of frequency supplied to the mixer 40. This may be accomplished through a feedback loop comprising, an automatic volume control stage, designated AVC, which receives the synthesizer output signal from output terminal T, a linear amplifier, designated AMP and a modulator 22. The mixer 21 receives the amplitude-modulated output of the modulator 22 and applies this output to the mixer 40. Instead of a constant reference voltage from source REF for generating an amplitude-regulating signal, a variable low frequency modulating signal, derived from a frequency modulating source designated MF, could be used with or without amplitude regulation to frequency modulate the modulator 22 and hence the "fixed" frequency applied to the mixer 40.

It is known in the art to supply to the phase-locking loop of a selectable oscillator the output frequency of a continuously tunable subfrequency generator instead of a supplying that oscillator with subfrequencies selected in a stepwise or incremental fashion. As an alternative, this prior art technique may also be used to advantage by the frequency synthesizer of this invention by connecting the output of a continuously tunable generator into the lower subfrequency generating stages of the synthesizer.

DETAILED DESCRIPTION OF THE INVENTION

In the following detailed description, particular frequencies and frequency bands as well as, for example, specific multiplication and division factors are disclosed by way of example only, in order to facilitate an understanding of the invention. It will be understood, however, that the values disclosed are merely exemplary and that the instant system may be designed by one skilled in the art to provide other values for the various circuits and parameters which are appropriate for the specific system requirements.

With reference to the drawing, the basic frequency generator of the instant synthesizer comprises a basic, precision oscillator 1 which oscillates at the exemplary frequency of 1 MHz. Preferably, the oscillator possesses extremely good long term operating stability, especially under thermal-controlled conditions. Thus, in selecting the basic oscillator consideration should be given not only to generating output signals of the requisite amplitude but additionally the oscillator should possess a good long term operating stability. Various types of quartz-crystal oscillators are currently available which will satisfy both of these requirements.

Coupled to receive the output of the oscillator 1 by way of a conventional frequency divider 13 is a bank or, more specifically, a decade of 10 conventional subfrequency generating stages 2 possessing good short term stability. Each such stage may comprise a voltage-controlled oscillator having the frequency thereof controlled by a DC voltage applied to, for example, a DC voltage-controlled varactor diode coupled in the regenerative feedback circuit of each oscillator. The subfrequency stages 2 are phase-locked with a divided (20:1) reference frequency of 50 kHz. obtained from the divider 13. The bank of 10 subfrequency stages 2 oscillate at different, precise respective frequencies of 18.9, 19.0, 19.1...19.8 MHz.

The basic oscillator frequency of 1 MHz is also divided by a divider stage 3 to 100 kHz. and multiplied 21 times by a conventional frequency multiplier 4 to provide an output signal having a frequency of 2.1 MHz. The latter frequency is mixed in a mixer 5 with that one of the precise subfrequencies produced by the oscillator in stage 2 which has been selected by means of a switching device, illustrated for simplicity as a mechanical switch 6. The signal at the output of the mixer 5 therefore has a frequency range of between 21 and 22 MHz and is applied to a filter 7 having a corresponding pass band of between 21 and 22 MHz. This band of frequencies is supplied to a frequency divider 8 having a frequency division ratio of 10:1 and the divided frequency is mixed by a mixer 9 with another subfrequency selected through operation of a switch 10.

The mixers 5 and 9 and the following mixer stages for handling the subfrequencies should comply with the requirement that since the frequencies to be mixed differ by about one order of magnitude, the output frequency of the mixer should fairly approximate one of the input frequencies. Under these circumstances, mixers of a conventional type may be used, or alternatively, the frequency mixer disclosed in copending U.S. Patent Application to Herbert Knirsch, Ser. No. 782,687 filed Dec. 10, 1968, and assigned to the same assignee of the instant invention may be used to advantage.

Instead of supplying the mixer 9 with a subfrequency signal derived from one of the subfrequency generating stages 2 by way of the mixer 5 and the filter 7, the output signal of a continuously tunable subfrequency generator, referred to generally by the numeral 11, and oscillating within a frequency band of between 21 and 22.5 MHz may be connected, as indicated by the phantom lines, to the input of the divider 8 and thusly to one input of the mixer 9.

Coupled to the output of the mixer 9 is another filter 12 having a band pass of between 21 and 22.5 MHz. A greater number of units than the single depicted unit formed of a divider 8, a mixer 9 and a switching device 10 may be connected between the filters 7 and 12. In the interest of simplifying the drawing and description as much as possible only one such unit is depicted, it being understood, however, that the greater the number of such units, the greater the resolution of the desired output frequency.

The 50 kHz. output of the divider stage 13, in addition to serving as a long term stabilized reference frequency for the subfrequency generating stages 2 is also supplied as a reference signal to a phase detector 14 coupled in the phase-locking loop of a quartz-crystal oscillator 15. The oscillator 15 preferably has a good short term stability and generates an exemplary auxiliary frequency of 40 MHz. The phase-locking loop of the oscillator 15 includes one frequency divider stage 16 having a frequency division ratio of 2:1, a second frequency divider stage 17 having a considerably higher frequency division ratio of 400:1 and a conventional damping circuit 18 designed to suppress high frequency transients in signals received from the phase detector 14. Due to the relatively high ratio of frequency division which takes place in the divider stage 17, short term phase incoherences are less likely to be introduced into the phase-locking loop and any such incoherences or transients are subsequently suppressed by the circuit 18. The output frequency of the oscillator 15, after frequency division by the divider stage 16, is further divided in a frequency divider stage 19 by a factor of 2. Thus the signal at the output of the divider 19, has a frequency of 10 MHz.

Coupled to the output of the oscillator 15 is a frequency multiplication stage 20 which multiplies the frequency of signals received from the oscillator 15 by a factor of 11. A fixed frequency of 480 MHz is also derived from the oscillator 15 in such a manner that in a multiplier stage 20 (1:11) a signal of 440 MHz is generated and supplied as one input to a mixer 21. This 440 MHz signal is additively mixed with the short and long term stabilized output signal (40 MHz) of the oscillator 15 supplied to the mixer 21 by way of modulator 22.

The modulator 22 comprises one circuit component of a feedback circuit which provides an amplitude regulated and/or frequency modulated signal to the mixer 21. This signal has both good short term and long term stability, for reasons which will be apparent. The feedback circuit additionally includes a conventional automatic volume control stage designated AVC, a linear amplifying stage, designated AMP, a source of DC or low frequency reference voltage, designated REF, and/or a source of modulating frequency designated MF. With the source REF in this feedback circuit the feedback voltage supplied by the modulator 22 to one input of the mixer 21 has an amplitude equal to the amplified difference between the output signal voltage derived from the stage AVC and this reference voltage.

In the illustrated embodiment, a bank, and more specifically, a decade, of ten voltage-controlled oscillators 23 is provided. Each oscillator produces an output defined as a discrete frequency band of 10 MHz and may comprise a conventional voltage controlled oscillator having the specific form of an oscillator with a varactor diode in its regenerative feedback circuit. The internal voltage (not shown) applied to each varactor establishes the mean frequency of oscillation. Manifestly, by supplying additional corrective voltages via lead L1 and the phase-locking loop to the varactor the output frequency of the oscillator may be correspondingly changed. The 10 oscillators, in increments of 10 MHz, encompass a total frequency range of 480—580 MHz. Moreover, each oscillator is selectable by means of switching devices which may be electronic and take the specific form of switching transistors, but for purposes of simplicity, are depicted as a single mechanical switch 24 which may be rotated by any suitable means, for example, by hand, to select one of the 10 MHz frequency increments. While the oscillator bank 23 may be of conventional type, it may also take the form disclosed in a copending U.S. Patent Application to Herbert Knirsch, Ser. No. 782,690, filed Dec. 10, 1968, and assigned to the same assignee of the instant invention.

The 10 MHz output of the divider 19 has both good long and short term stability since it merely divides 20 MHz input signals having these characteristics. Simultaneously with this switching operation, another switching device, depicted for the same reason, as the single switch 25 is driven to couple the output of one of six filters 26 having respective pass bands of 10, 20...60 MHz to the input of the mixer 27. Each filter 26 is designed to pass only one auxiliary harmonic frequency, for example, the fundamental, second, third, fourth, fifth or sixth harmonic, respectively, of the complex auxiliary signal waveform received from the divider 19. The mixer 27 adds the selected frequency obtained from the bank of oscillators 23 with a selected harmonic of the auxiliary frequency derived from a particular one of the filters 26 and applies the additive frequency to a filter 28 having a pass band which is broad enough to pass the additive frequency.

Mixer stage 29 receives as one input the filtered input of the filter 28 and a selected one of the ten available highest subfrequencies as the other input. The selected one of the highest subfrequency is derived from the basic oscillator 1 after frequency multiplication in a multiplier 30 (1:10). Respective exemplary subfrequencies of 18.9...19.9 MHz are obtained from the various corresponding subfrequency stages 2. A subfrequency signal selection switch, again depicted as a single switch 31, may be driven to selectively connect one of the output lines of the multiplier 30 to the input of the mixer 29. The switch 32 is toggled to the switch 31 so as to simultaneously select and apply via lead L1 DC voltage from a regulated DC voltage source 33 which will coarsely tune the selected main oscillator to the subfrequency selected by the switch 31.

The mixer 29 is followed by a filter stage 34 tuned to pass the difference frequencies produced by the mixer 29. Again, employing exemplary values, the frequencies passed by the filter 34 would range from 341 MHz (530 minus 189 MHz) to 342 MHz (540 minus 198 MHz). The filter 34 need only have a pass band of between 341 and 342 MHz unless it is also desired to utilize a continuously tunabled subfrequency generator 11, instead of stepwise variable frequency sources. In such case, it may be necessary to vary the frequency of the generator 11 beyond its zero-point by about 0.5 MHz and consequently a frequency of about 342.5 MHz must also be permitted to pass through the filter 34 by increasing the high pass frequency range of the filter correspondingly. Coupled to the output of the filter 34 is a mixer 35. The mixer 35 additionally receives at its input a frequency which as been generated previously by mixing the low order subfrequencies, as explained above.

Coupled to the output of the mixer 35 is a filter 36 tuned sharply to the frequency of interest, in this instance, 320 MHz. This frequency is compared in a conventional phase detector 37 with a reference frequency of 320 MHz. The reference signal has both short- and long-term stability as a result of being derived from the frequency stabilized auxiliary output of the oscillator 15 and after undergoing multiplication by a factor of 8 in a frequency multiplier 38. The DC regulating voltage for finely tuning the selected main oscillator in the bank 23 to the desired frequency value is generated by the phase detector 37 and is supplied to that main oscillator by way of a lead L2 and a conventional damping circuit 39. The damping circuit 39 may be similar to the aforedescribed damping circuit 18 and similarly serves to dampen or attenuate transients in the corrective DC feedback signals derived from the phase detector 37 especially during operation of the various switches 6, 10 and 31.

For reasons discussed hereinabove, the output frequency of the selected main oscillator in the bank 23 is supplied to one of the inputs of the mixer stage 27. This frequency is also applied via a lead L3 to one of the inputs of output mixer 40, the other input of this mixer receiving the fixed frequency of 480 MHz from the mixer 21. Accordingly, the frequencies which can be delivered at output terminal T by the aforedescribed embodiment of the instant synthesizer range from 0.0000 MHz (480 MHz minus 480 MHz) to at least 99.9999 MHz (580 MHz minus 480 MHz).

It may be useful to explain by way of a specific example the manner in which a particular output frequency within the indicated frequency range is generated by the instant frequency synthesizer.

In furtherance of this objective, the output frequency desired of the instant synthesizer will be assumed to be 32.3642 MHz and each digit is to be defined through a sequence of operations beginning with the selection of the frequency which corresponds to the most significant digit 3.

It will be appreciated that, if mechanical, the switch 24 may be mounted for rotation on a console provided with indicia to indicate to an operative the various respective decade ranges 0—10, 10—20...90—100 MHz of the synthesizer. if the switch 24 is electronic in nature, comprising for example, ten electronic switching devices, appropriately numbered pushbuttons, for instance, may be actuated to effect a closure or enabling of that device which will cause the desired oscillator output frequency to appear on lead L3. Assuming the switch is mechanical, it is rotated to a position, illustrated by dashed lines in the drawing, which corresponds to a range of 30...40 MHz because the most significant digit 3 lies in the most significant decade range between 30 and 40 MHz. It will be understood that the selection switches 6, 10 and 31 may be similarly mounted to provide an indication as to the contact positions of each such switch or the switches may be electronic in nature and hence closed accordingly. With the switch 24 in the illustrated fourth switch position, a frequency of between 30—40 MHz is delivered at the output terminal T because the modulator 40 will mix (subtract) the fixed frequency of 480 MHz with (from) the frequency range of the oscillator in the fourth frequency decade of the bank 23, that is, with frequencies in the bank of oscillator 23 ranging from 510 to 520 MHz. It will be apparent, that to obtain the desired output frequency of 32.2642 MHz the selected fourth oscillator must oscillate at precisely 512.3642 MHz.

To ensure that the selected oscillator in the bank 23 will operate at this frequency and no other, this oscillator is phase-locked to the short- and long-term stabilized reference frequency of 320 MHz produced at the output of the multiplier 38. With a filter 28 in the phase-locking loop tuned to pass frequencies ranging from 530 to 540 MHz the frequency applied to one input of the mixer 27 by the selected main oscillator is mixed with an appropriate pure harmonic frequency derived from one of the filters in the bank 26. The harmonic is selected to produce an additive frequency output which falls within the pass band of the tuned filter 28. Hence, in this example, a first harmonic of 20 MH, should be supplied to the mixer 27 in order to increase the input frequency to the filter 28 by 20 MHz to 532.3642 MHz. A frequency of 532.3642 MHz is accordingly supplied to one input of the mixer 29.

In order to bring the mixed frequency at the output of the mixer 29 within the pass band of the filter 34 of indicated bandwidth, the highest subfrequency selected from the available subfrequencies 189, 190...198 MHz should be 191 MHz for the reason that 532.3642 MHz minus 191 MHz equals 341.3642 MHz, this latter frequency falling within the prescribed pass band of the filter 34. The switch 31, therefore, should be set to receive the output from the output line of the multiplier 30 which corresponds to the third position 2—3 MHz in order to provide correct correlation with the second most significant digit of the desired frequency.

In order to make the output frequency of the mixer 35 exactly equal to the fixed frequency of 320 MHz, the mixer 35 is supplied with a subfrequency of 341.3642 MHz minus 320 MHz or 21.3642 MHz from the filter 12.

This latter frequency is generated in a manner known to those skilled in the art, but in order to provide a complete description of the invention this manner will be described as follows.

The mixer 5 is supplied with the fixed frequency of 2.1 MHz from the multiplier 4 and with a selected one of the frequencies from the subfrequency generating stages 2 which defines the least significant digit of the desired frequency value. Since the least significant digit of the desired frequency is the decimal number 2 (the least significant digit of 21.3642), the third one of the ten available frequencies, that is, the stage producing a frequency of 19.1 MHz should be selected by operation of the switch 6 because the resulting frequency from the mixer 5 then will be a frequency of 19.1 MHz plus 2.1 MHz or 21.2 MHz. This frequency passes through the tuned filter 7, is divided by a factor of 10 by the divider 8, and is supplied as one input to mixer 9. Another one of the lower order subfrequencies which is now derived from the bank 2 through switch 10 is mixed with the frequency output of divider 8 to define the next-to-least significant digit, that is, the numeral 4. Since one input frequency to the mixer 9 is 2.12 MHz, to obtain an output frequency from this stage of 21.42 MHz requires the application via the switch 10 of 19.3 MHz to the other input of the mixer 9.

To obtain the desired resolution to four decimal places requires two additional intermediate units, not shown by the drawing. It will be understood, however, that each of such units comprises a frequency dividing decade (10:1), a frequency mixing stage, a tuned filter and a switching device for selecting the subfrequency which must be mixed to obtain the desired frequency of the particular intermediate digit.

Hence, following the above example to conclusion and assuming such intermediate units are available in the instant synthesizer, the output frequency of mixer 9, that is, a signal of frequency 21.42 MHz would be divided by a factor of 10 and the resulting frequency of 2.142 MHz additively mixed with 19.5 MHz to define the third least significant digit 6 since 19.5 MHz plus 2.142 MHz yields 21.642 MHz. This latter frequency is then divided again and mixed with 19.2 MHz to produce the desired frequency of 21.3642 MHz at the output of the filter 12. As will be apparent, the number of such intermediate units may be increased to further increase the resolution of the selected frequency.

We claim:

1. A frequency synthesizer for providing selected frequency values from a band of frequencies ranging from low audio to UHF comprising, a first oscillator for producing signal frequencies having a good long-term stability, a second oscillator phase-locked to said first oscillator for producing an auxiliary frequency having a good short- and long-term stability, a third, stepwise variable, oscillator for producing various frequencies of stepwise selectable values, first means coupled to said third oscillator for coarsely selecting corresponding frequencies of higher frequency values, second means coupled to the said third oscillator for finely selecting corresponding frequencies of lower frequency values, means for locking the phase of the selected corresponding frequencies to a reference frequency derived from said auxiliary frequency, means coupled to said second oscillator for modifying the frequency of said auxiliary frequency to provide a mixing frequency, and means for mixing said mixing frequency with said selected corresponding frequencies to provide a synthesizer output frequency of selected value having good short- and long-term stability.

2. A frequency synthesizer for providing selected frequency values from a band of frequencies ranging from low audio to UHF comprising, a first oscillator for producing signal frequencies having a good long-term stability, a second oscillator phase-locked to said first oscillator for producing an auxiliary frequency at an output thereof having good short-term stability, means for generating at least one harmonic of a subfrequency from said auxiliary frequency, third, stepwise variable frequency, oscillator means for producing different stepwise selectable frequencies, coarse frequency selection means coupled to said third oscillator means and to the harmonic generating means for providing frequencies corresponding to higher selected frequency values, fine frequency selection means coupled to the said third oscillator means for providing frequencies corresponding to selected frequencies of lower frequency values, means for locking the phase of the frequencies selected by said coarse and fine frequency selection means to a reference frequency derived from said auxiliary frequency, means coupled to said second oscillator for modifying the frequency of said auxiliary frequency to provide a modified frequency having good short- and long-term stability, and means for mixing said modified frequency with said selected corresponding frequencies to provide a synthesizer output frequency of selected values having good short- and long-term stability.

3. The synthesizer as claimed in claim 2 wherein the frequency modifying means comprises, frequency multiplying means for increasing said auxiliary frequency by a predetermined factor.

4. The synthesizer as claimed in claim 2 wherein said second oscillator is phased-locked to said first oscillator by a phase-locking circuit, said circuit comprising a phase comparator coupled to receive as one input a subfrequency of the output frequency of said first oscillator and as another input a frequency substantially equal to said subfrequency from the output of said second oscillator, and a low-band pass filter coupling the output of said phase comparator to the input of said second oscillator.

5. The synthesizer as claimed in claim 4 which further comprises, frequency dividing means having an output thereof coupled to the input of the harmonic frequency generating means and an input thereof coupled to the output of said second oscillator for supplying a short- and long-term stabilized subfrequency of said auxiliary frequency to the input of said harmonic generating means.

6. The synthesizer as claimed in claim 2 wherein said first oscillator is a crystal-controlled main oscillator and said second oscillator is a crystal-controlled auxiliary oscillator and further, wherein said third oscillator means comprises a plurality of voltage-controlled oscillators, different ones of said voltage-controllable oscillators being selectable by said coarse frequency selection means, the selected voltage-controllable oscillator producing at least one coarse output frequency determined by said coarse selection means and at least one fine output frequency determined by said fine selection means.

7. The synthesizer as claimed in claim 2 wherein said first and second oscillators are crystal-controlled, and further wherein said third oscillator means comprises, a decade of voltage-controlled oscillators of successively increasing values of mean frequency output, first frequency mixing means coupled to said coarse frequency selection means for mixing the frequency of a selected one of said voltage-controlled oscillators with a selected harmonic output of the harmonic generating means corresponding to the selected frequency of next-to-highest order of significance to produce a first mixed output signal corresponding to the selected frequencies of respective highest and next-to-highest order of significance, second frequency mixing means for mixing said first mixed output signal with at least one frequency of lower order of significance selected by said fine frequency selection means, the phase-locking means including said second frequency mixing means and supplying a fine compensating control signal determined at least by said frequency of lower order of significance to the selected one of said voltage-controlled oscillators so that said selected one of said voltage-controlled oscillators is synchronized with said reference frequency.

8. The synthesizer as claimed in claim 7 which further comprises, subfrequency generating means coupled to said first oscillator for generating a decade of long-term stabilized subfrequencies from said first oscillator output of successively increasing mean frequency values, and wherein the fine frequency selection means comprises, at least one switching device coupled to said second mixing means for selecting different ones of the subfrequency outputs of said subfrequency generating means.

9. A frequency synthesizer comprising, a basic oscillator for producing a frequency having a good long-term stability, a plurality of voltage-controllable main oscillators for producing a plurality of different mean frequencies, an auxiliary oscillator phase-locked to said basic oscillator for producing a short-term stabilized auxiliary frequency which is a multiple of the basic oscillator frequency, at least one harmonic generator coupled to said auxiliary oscillator for producing a short- and long-term stabilized harmonic submultiple of the auxiliary frequency, means for selecting a frequency from one of said voltage-controlled oscillators and said harmonic frequency, means coupled to the selecting means for mixing the selected frequencies to produce a resultant frequency which corresponds to higher values of the selected frequencies, at least one subfrequency generator for producing a subfrequency corresponding to a lower and selectable frequency value, and circuit means coupling said auxiliary oscillator, the mixing means and said subfrequency generator for phase-locking said one voltage-controllable oscillator to a first frequency which is a multiple of said auxiliary frequency.

10. The synthesizer as claimed in claim 9 which further comprises, means coupled to said auxiliary oscillator and to said voltage-controllable oscillators for mixing the frequency of said one voltage-controllable oscillator with a second frequency multiple of said auxiliary frequency to provide an output frequency equal to the selected frequency.

11. The synthesizer as claimed in claim 10 wherein said subfrequency generator is continuously variable.

12. The synthesizer as claimed in claim 10 wherein said subfrequency generator is stepwise variable.

13. The synthesizer as claimed in claim 10 which further comprises, means for modulating said second frequency multiple.